(12) United States Patent
Zou

(10) Patent No.: US 7,259,620 B2
(45) Date of Patent: Aug. 21, 2007

(54) WIDE DYNAMIC RANGE SWITCHING VARIABLE GAIN AMPLIFIER AND CONTROL

(75) Inventor: Min Z. Zou, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 163 days.

(21) Appl. No.: 11/166,089

(22) Filed: Jun. 27, 2005

(65) Prior Publication Data

US 2006/0290420 A1 Dec. 28, 2006

(51) Int. Cl.
 *H03F 1/14* (2006.01)
(52) U.S. Cl. .................. 330/51; 330/310; 330/284
(58) Field of Classification Search ............ 330/51, 330/310, 284
See application file for complete search history.

(56) References Cited

U.S. PATENT DOCUMENTS

| | | | |
|---|---|---|---|
| 3,594,652 A | 7/1971 | Springer et al. | |
| 4,598,252 A * | 7/1986 | Andricos | 330/51 |
| 5,077,541 A | 12/1991 | Gilbert | |
| 5,432,478 A | 7/1995 | Gilbert | |
| 5,548,246 A * | 8/1996 | Yamamoto et al. | 330/51 |
| 5,684,431 A | 11/1997 | Gilbert et al. | |
| 6,172,549 B1 | 1/2001 | Gilbert | |
| 6,204,719 B1 | 3/2001 | Gilbert | |
| 6,348,829 B1 | 2/2002 | Gilbert | |
| 6,400,227 B1 | 6/2002 | Goldfarb et al. | |
| 6,429,720 B1 | 8/2002 | Gilbert | |
| 6,437,630 B1 | 8/2002 | Gilbert | |
| 6,445,248 B1 | 9/2002 | Gilbert | |
| 6,489,849 B1 | 12/2002 | Gilbert | |
| 6,525,601 B2 | 2/2003 | Gilbert | |
| 6,842,071 B1 * | 1/2005 | Retz et al. | 330/133 |
| 6,927,628 B2 * | 8/2005 | Oshima et al. | 330/133 |
| 7,098,738 B2 * | 8/2006 | Tam et al. | 330/284 |

FOREIGN PATENT DOCUMENTS

| | | |
|---|---|---|
| EP | 0638 997 A1 | 8/1991 |
| FR | 2 721 155 A1 | 8/1994 |

OTHER PUBLICATIONS

Analog Related Product AD8367, "500MHz, 45dB Linear-in-dB Variable Gain Amplifier," with AGC Detector, released most likely in 2001.
Analog Related Product AD8362, "50Hz to 2.7GHz 60dB TruPwr Detector," released in 2003.
Analog Related Product AD8361, "2.5GHz TruPwr Detector," released most likely in 2001.

* cited by examiner

*Primary Examiner*—Patricia Nguyen
(74) *Attorney, Agent, or Firm*—McDermott Will & Emery LLP

(57) ABSTRACT

A plurality of variable gain amplifier stages are coupled by an attenuation circuit that receives a voltage input to be amplified. A control circuit activates each of the variable gain amplifier stages in a seamless manner in accordance with a control signal applied to a voltage control node, while maintaining no more than one of the stages active at any time. Fractions of the reference signal voltage level are set to define boundaries between control voltage level ranges of the amplifier stages. A unique control voltage level range is thus established for each amplifier stage. A control voltage hysteresis range can be provided to avoid oscillations between stages at the transition voltages.

20 Claims, 4 Drawing Sheets

WIDE DYNAMIC RANGE SWITCHING VARIABLE GAIN AMPLIFIER AND CONTROL

TECHNICAL FIELD

The present disclosure relates to variable gain amplifiers, more particularly to a wide dynamic range amplifier having a plurality of switched amplifier stages.

BACKGROUND

A variety of circuit applications require high accuracy variable gain amplification over wide frequency bandwidths. For example, linear-in-db true power detectors have been needed for measurement and control of true electrical power over an operating frequency range from low frequency to as high as 2.5 GHz, with a 60 dB dynamic range. As these operating ranges continue to increase, challenges are presented to provide the required high accuracy amplification. A variable gain amplifier, operable over an extended frequency bandwidth should consume a minimum of power while maintaining high accuracy over a wide range of temperature variation.

SUMMARY OF THE DISCLOSURE

The subject matter described herein fulfills the above-described needs. A plurality of variable gain amplifier stages are coupled by an attenuation circuit that receives a voltage input to be amplified. A control circuit activates each of the variable gain amplifier stages in a seamless manner in accordance with a control signal applied to a voltage control node, while maintaining no more than one of the stages active at any time. Fractions of the reference signal voltage level are set to define boundaries between control voltage level ranges of the amplifier stages. A unique control voltage level range is thus established for each amplifier stage.

For each amplifier stage, a comparator is coupled by its first input to the voltage control node. A second attenuation circuit is coupled between a voltage reference node and a second input of each comparator. The second attenuation circuit nodes set the control voltage level boundary ranges. Each amplifier stage is activated in dependence upon an output from its corresponding comparator. The output of each comparator is coupled to a switch node, which can receive a switch activation signal to activate the corresponding amplifier stage at an activation input thereof.

As the level of the control voltage is varied, a new one of the amplifier stages is activated when the level of the control voltage is within the control voltage level range for the new amplifier stage and the previously activated amplifier stage is deactivated. A seamless transition between activated stages takes place. To avoid transition oscillation, the voltage control node can be connected to the first input of each comparator through a respective impedance. A junction between the first input of each comparator and its respective impedance is then connected to a respective controlled switch that is activated by the switch node corresponding to the comparator to which it is coupled. When an amplifier stage is activated, the lower boundary level of the control voltage range for that amplifier stage is reduced by impedance inserted by the controlled switch activation. Amplifier stage transition hysteresis is thus provided.

A logic circuit, having a plurality of outputs, is connected to each comparator output. One of the switch nodes is coupled directly to the output of one of the comparators, the remaining switch nodes being coupled to a respective output of the logic circuit. Each switch node also is coupled to a respective voltage level shift stage that can be activated in response to a received switch activation signal from the switch node. An input of each voltage level shift stage is coupled to a respective node of the second attenuation circuit. The voltage control node and the voltage level shift stages are coupled to a voltage to current converter circuit that produces a current control signal related to a shifted level of the voltage at the voltage control node.

A circuit is provided to compensate for the effects of temperature. A multiplier has a first input coupled to the output of the voltage to current converter for receiving the current control signal, and a second input for receiving a temperature compensation signal. The multiplier output is coupled to an amplifier gain control circuit to provide a current control signal thereto that is adjusted for temperature.

Additional advantages will become readily apparent to those skilled in this art from the following detailed description, wherein only the preferred embodiments are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Implementations of the present invention are illustrated by way of example, and not by way of limitation, in the figures of the accompanying drawings and in which like reference numerals refer to similar elements.

DETAILED DESCRIPTION

Figure 1:
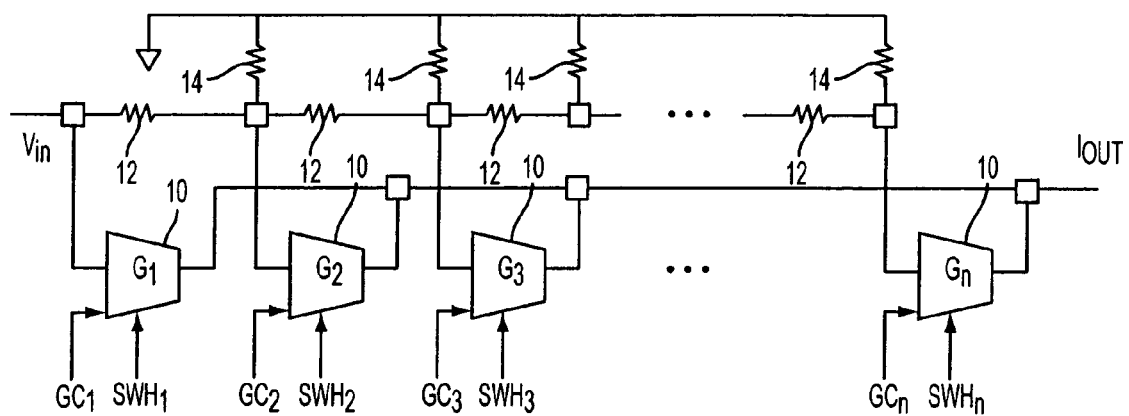
FIG. 1 is a block diagram of a multi-stage variable gain amplifier in accordance with the present invention.

A multi-stage variable gain amplifier in accordance with the present invention is illustrated in the block diagram of FIG. 1. The amplifier is coupled to a variable input voltage $V_{IN}$ and produces an output signal at $I_{OUT}$. A plurality of amplifier stages 10, indicated as $G_1$-$G_n$, each have an output connected to $I_{OUT}$. Each gain stage is a variable gain amplifier, such as any known amplifier having at least a limited range of gain control. $V_{IN}$ is coupled to an attenuation circuit that comprises a plurality of series connected resistors 12, with a junction between each pair of transistors connected to ground through a resistor 14. The values of the resistors may be equal to each other or selected to provide a desired relationship between the voltage magnitudes at the junctions and $V_{IN}$. The illustrated resistors are merely representative of any impedances that may serve a voltage dividing functionality. Preferably, a fixed series-shunt resistive attenuation is provided between any two amplifier stages.

An input of amplifier stage $G_1$ is directly connected to $V_{IN}$. Inputs of amplifier stages $G_2$-$G_n$ are connected to successive junctions at lower proportional voltage magnitudes. The gain of each amplifier stage is controlled by a respective gain control signal $GC_1$-$GC_n$. Each amplifier stage is turned on or off by a respective switch activation signal $SWH_1$-$SWH_n$. Only one gain stage is activated at any time. The switch activation signals are responsive to a variable analog control signal as described hereinafter. By seamlessly synchronizing the individual gain stages and the gain control of each stage throughout the range of the control signal, a much wider dynamic range of variable gain amplification can be obtained with wide operating frequency bandwidth at low power consumption.

Figure 2:
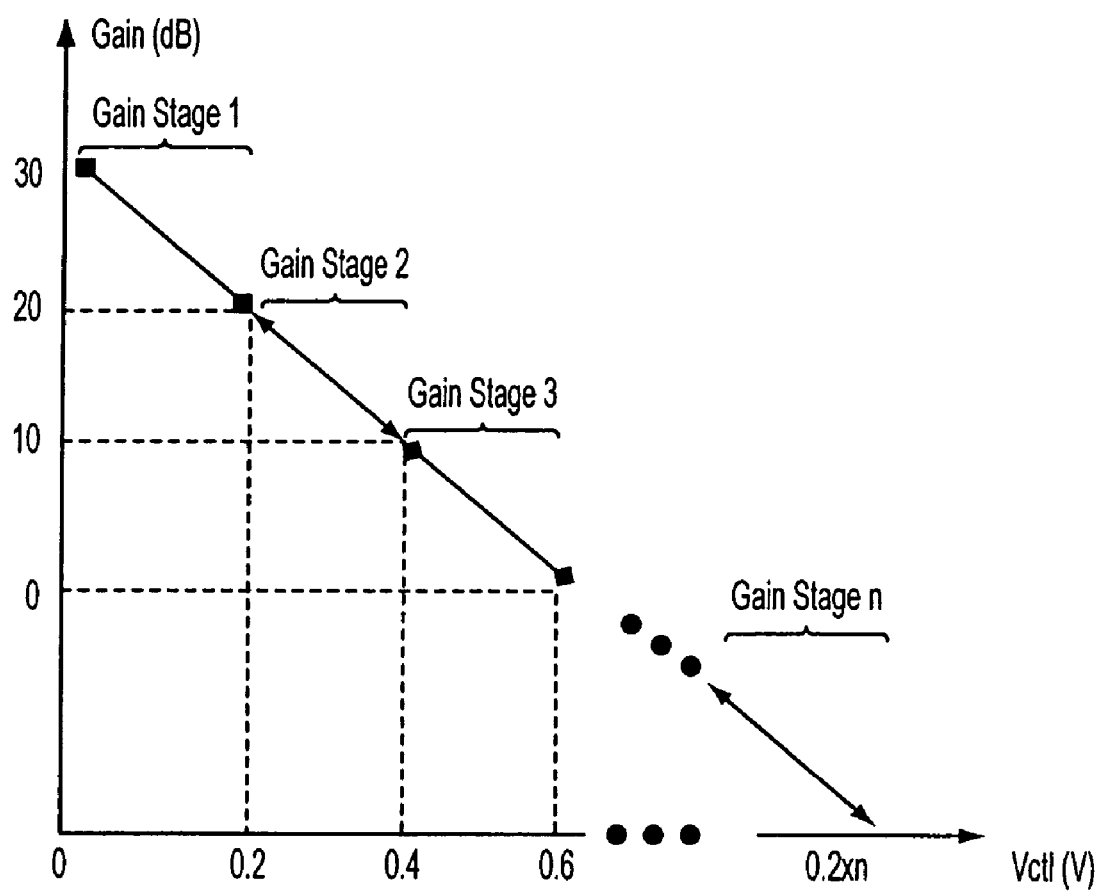
FIG. 2 is a diagram of a gain control characteristic of the variable gain amplifier of FIG. 1.

A desirable gain control characteristic in dB versus analog control voltage $V_{ctl}$ is exemplified in FIG. 2. The gain response is linear in dB throughout the entire control voltage range. As shown, each of the gain stages is selected to be activated for a particular range of control voltage of 0.2 volt. The maximum gain is produced at near zero control voltage, the gain decreasing in linear manner as the control voltage increases to a maximum. Amplifier stage $G_1$, which is directly connected to the input voltage, outputs the greatest gain over a control voltage range of up to 0.2 volt. Each successive amplifier stage receives a more greatly attenuated input voltage and is activated at a higher control voltage range than the preceding stage. The boundaries of the control voltage range for the first amplifier stage are zero and 0.2 volt; for the second amplifier stage the control voltage range boundaries are 0.2 volt and 0.4 volt, etc. The ranges of gain and control voltage shown are merely illustrative, as the voltage magnitude of the control voltage range can be selected in accordance with the number of amplifier stages and the operating parameters of the stages.

Figure 3:
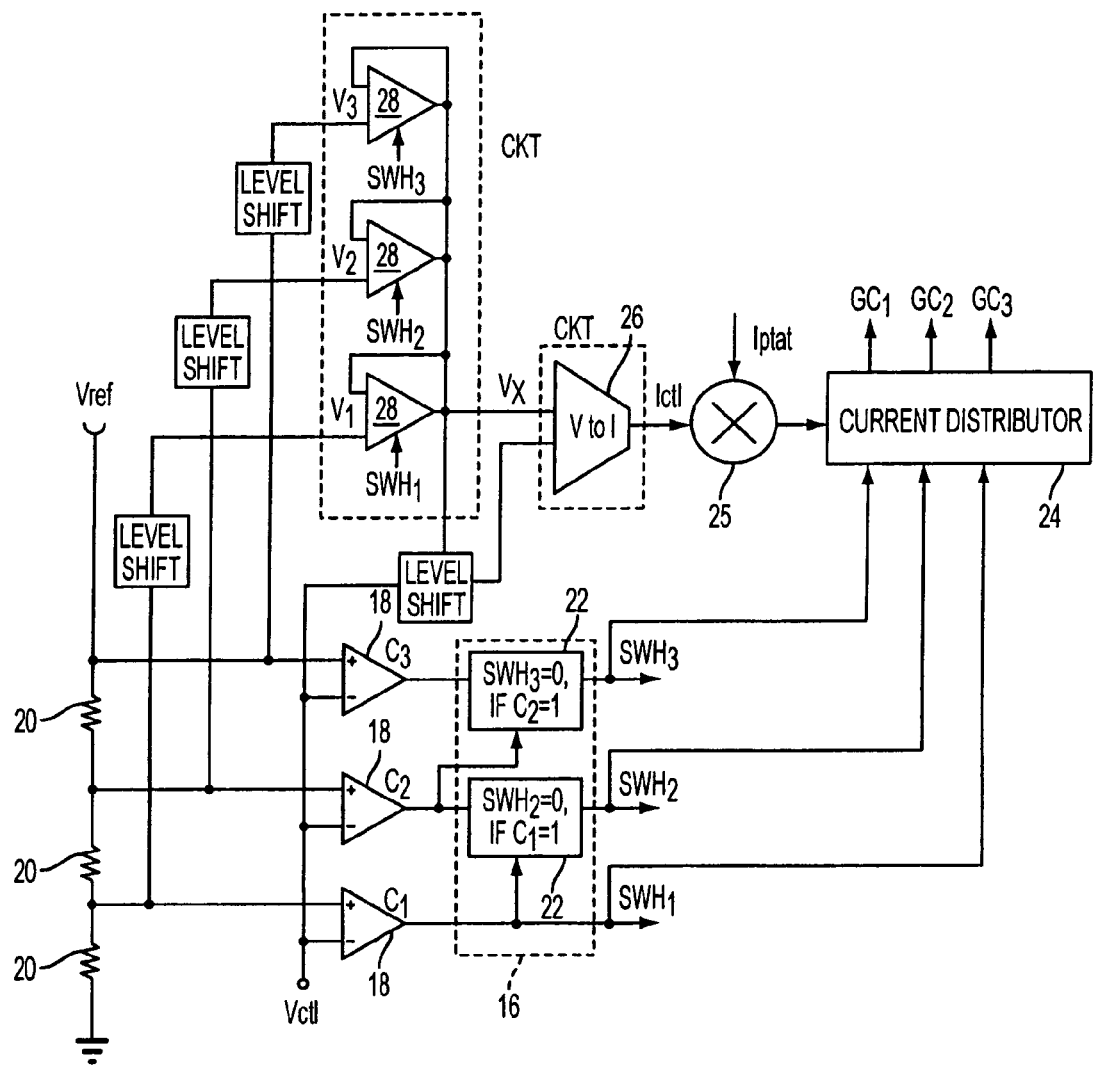
FIG. 3 is a block diagram of a control scheme for the variable gain amplifier of FIG. 1.

FIG. 3 is a block diagram illustrative of the activation and control scheme for operating amplifiers $G_n$. For simplicity of illustration and explanation, three amplifier stages are considered. The number of stages used in any particular implementation can be increased to provide a desirable broader range of amplification. Switch activation signals $SWH_1$-$SWH_3$ are produced in response to the outputs of respective comparators 18. A negative input of each comparator is connected to the control voltage $V_{ctl}$. A reference voltage $V_{ref}$ is coupled to an attenuation circuit that comprises a plurality of series connected resistors 20 and ground. A junction of each resistor 20 is connected to a positive input of a respective one of the comparators 18.

For the described example of FIG. 2, the values of $V_{ref}$ and resistors 20 are selected to provide voltage step differences of 0.2 volt at adjacent resistor junctions. The negative input of comparator for the first stage $G_1$, which outputs the signal $SWH_1$, receives the lowest reference voltage input, 0.2 volt. The comparator of each successive stage receives a higher reference voltage at its negative input. Each comparator will output a high signal until the control voltage exceeds the reference voltage applied to its positive input. A logic circuit 16 comprises logic elements 22 that receive inputs from the second and third stage comparators, respectively to produce switch activation signals $SWH_2$ and $SWH_3$. Each logic circuit element 22 also receives an input from the comparator of the preceding stage and is designed to provide a high level switch activation signal only if the output of the preceding stage comparator is low and the output of its corresponding stage comparator is high. This operation ensures that only one amplifier stage is activated during a given control voltage range.

Switch activation signals $SWH_1$-$SWH_3$ are fed to a gain control setting current distributor 24. Only one of the gain control signals $GC_1$-$GC_3$ is output for the amplifier stage that corresponds to a high level switch activation signal received at the current distributor input. The gain control signals are produced in accordance with a current control signal $I_{ctl}$ and a temperature compensation signal $I_{ptat}$. The temperature compensation signal, which preferably is generated by a current source, is proportional to the absolute value of temperature. These signals are multiplied by multiplier 25 and applied as a compensated gain control signal to the current distributor.

Current control signal $I_{ctl}$ is output by differential voltage to current converter circuit 26. This circuit has a first input $V_x$ that is a shifted level of the reference voltage applied to the selected one of the comparators 18 and a second input that is a shifted level of the control voltage. The output signal of the voltage to current converter circuit 26 is related to the difference between the two input signals. A switched operational amplifier 28 is coupled to the reference voltage input of each comparator 18 to receive reference voltage V1 for the first stage, reference voltage V2 for the second stage, and reference voltage V3 for the third stage. Switch activation signals $SWH_1$-$SWH_3$ are coupled to respective inputs of the amplifiers 28.

As the control voltage is varied from zero to its maximum, such as exemplified in FIG. 2, the following operation occurs. In the control voltage range from zero to 0.2 volt, each of the outputs of comparators 18 will be at a high level. The logic circuit 16 permits only switch activation signal $SWH_1$ to be high. This high level signal is applied to the current distributor circuit to apply a gain control signal output at $GC_1$. The high level $SWH_1$ signal is also applied to activate the operational amplifier 28 that corresponds to the first stage to output V1 as $V_x$. Current control signal $I_{ctl}$, related to the difference between the two input signals to the voltage to current converter circuit 26, is multiplied by the temperature compensation signal $I_{ptat}$ and applied by the current distributor to produce the signal $GC_1$. As the control signal is increased within the range for the first amplifier stage, the gain control signal will be varied, decreasing linearly as shown in FIG. 2.

When the control voltage increases beyond 0.2 volt to the range of the second stage, the output of the first comparator will be low while the outputs of the remaining comparators are high. The logic circuit outputs a high level $SWH_2$ signal. $SWH_3$ and $SWH_1$ are low. The operational amplifier 28 that corresponds to the second stage is activated to output V2 as $V_x$. The current distributor circuit 24 is activated to apply a gain control signal output at $GC_2$, which varies as the voltage control level increases until the higher second stage boundary range voltage of the second stage is reached. As the control voltage continues to increase, similar operation occurs for successive amplifier stages.

Each of the operational amplifiers 28 continuously has applied to its input the appropriately shifted reference voltage for its corresponding gain stage. Likewise, one input to the current converter circuit 26 continuously receives a shifted $V_{ctl}$. Upon a change of the logic circuit 22 output select signal output SWH responsive to a change in the control voltage range of $V_{ctl}$, the appropriate operational amplifier 28 and gain stage GC are substantially simultaneously activated, thereby effecting an immediate transition to the next amplifier stage.

Figure 4:
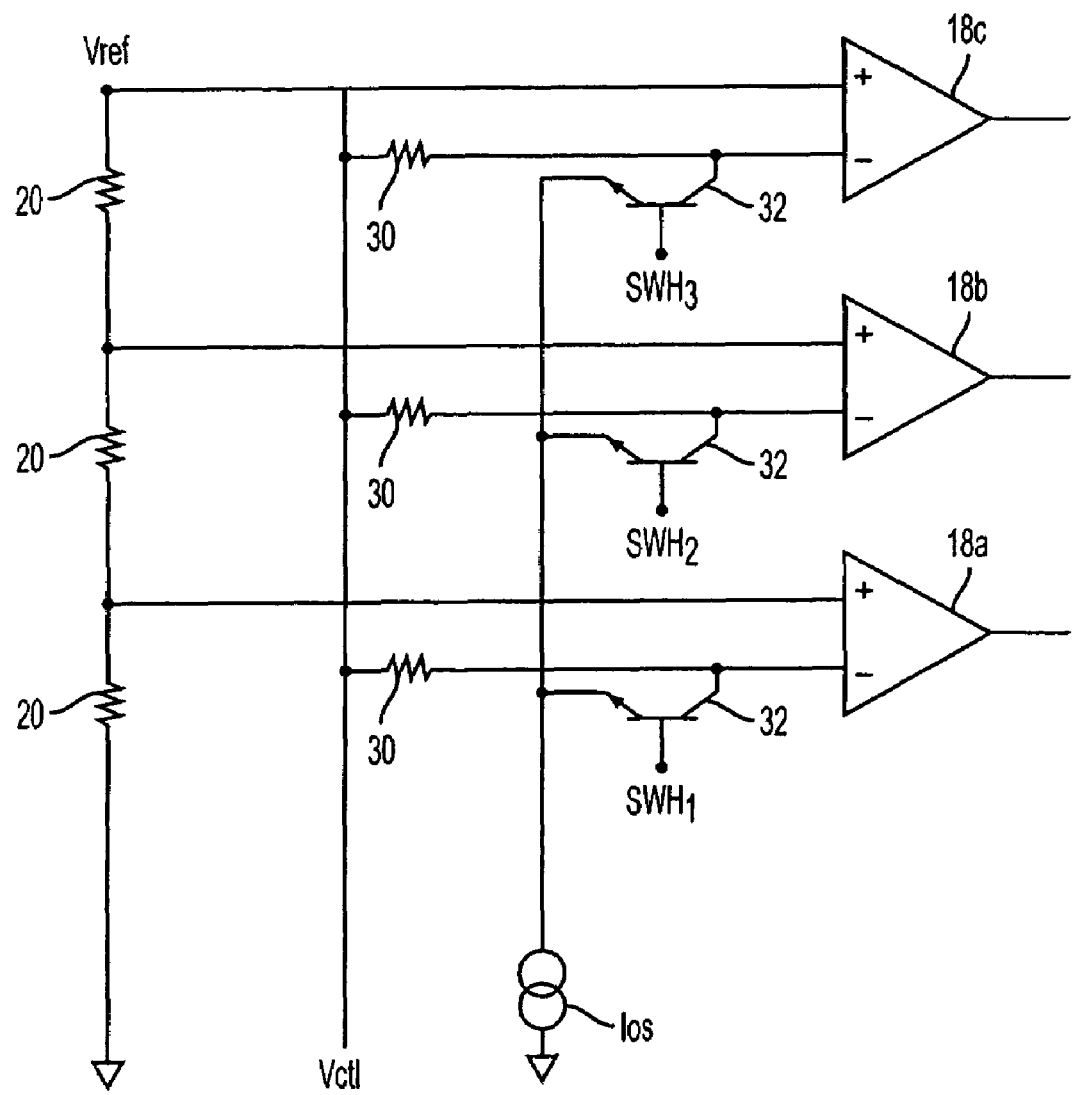
FIG. 4 is a block diagram for a variation of the block diagram of FIG. 3 with a modification of the comparator input circuits.

FIG. 4 is a block diagram of a variation of the control scheme of FIG. 3. The comparator input circuits have been modified to assure that only one gain stage is on when the control voltage $V_{ctl}$ is at or close to the transition voltage between any adjacent gain stages. For clarity of operation explanation, the comparators 18 have been further referenced as 18a-18c to correspond, respectively, to stages 1-3. The control voltage input of each comparator 18 is coupled to the control voltage $V_{ctl}$ through a resistor 30. A controlled switch 32 is coupled between the comparator side of each resistor 30 and ground through a current source $I_{OS}$. The control terminal of each switch 32 is coupled to one of the switch activation signals $SWH_1$-$SWH_n$ of the corresponding amplifier stage.

Transitional operation is considered for the 0.2 volt range of control voltage for transition between stages in the example of FIG. 2. The reference voltage input at comparator 18a is 0.2 volt, at comparator 18b is 0.4 volt, and increases by 0.2 volt at each successive comparator. When the control voltage is below 0.2 volt it is lower than the reference voltage input at each of the comparators. The outputs of all comparators are at a high logic level. However, only switch activation signal $SWH_1$ is at a high level, as logic circuitry 16 precludes elevation of the higher stage switch activation signals. Only the first amplifier stage is in operation. The switch 32 of the first stage is active in response to the switch activation signal to provide a current path through resistor 30. The voltage at the control (negative) input to comparator 18a is less than the control voltage by the voltage drop across resistor 30.

Transition to second stage operation will occur when the control input to comparator 18a rises to the transition boundary of 0.2 volt. At that time, $V_{ct}$ is greater than 0.2 volt by the amount of the voltage drop across resistor 30. The comparator output will change to a low logic level, switch activation signal $SW_1$ will change to a low logic level to turn off the first amplifier stage, and switch activation signal $SW_2$ will change to a high logic level to turn on the second amplifier stage. The switch 32 of the first amplifier stage will be deactivated to cease current flow in the series connected resistor 30. In the absence of the resistive voltage drop, the voltage at the control input to comparator 18a jumps to $V_{ctl}$. Operation will not transition back to the first amplifier stage until $V_{ctl}$ falls below 0.2 volt. Thus, a control voltage hysteresis range is built in to avoid oscillations between stages at the boundary transition voltage. The same hysteretic transitional operation is provided at transitions between the other amplifier stages. The range of hysteresis can be changed by adjusting the current source $I_{OS}$ and/or selecting a different value of resistance for resistors 30.

In this disclosure there are shown and described only preferred embodiments of the invention and but a few examples of its versatility. It is to be understood that the invention is capable of use in various other combinations and environments and is capable of changes or modifications within the scope of the inventive concept as expressed herein.

What is claimed is:

1. An amplifier comprising:
   a plurality of variable gain amplifier stages;
   an attenuation circuit coupled between an input voltage and the amplifier stages; and
   a control circuit for activating the amplifier stages in accordance with a control signal;
   wherein the control circuit is configured to maintain no more than one of the stages active at any time, and comprises:
   a plurality of comparators corresponding, respectively, to each of the plurality of amplifier stages;
   a voltage control node for receiving the control signal, the voltage control node coupled to a first input of each of the comparators;
   a voltage reference node for receiving a reference voltage; and
   a second attenuation circuit connected to the voltage reference node, a second input of each of the comparators connected to the second attenuation circuit;
   wherein each of the amplifier stages is activated in dependence upon an output from its corresponding comparator.

2. An amplifier as recited in claim 1, further comprising:
   a plurality of switch nodes, each for receiving a switch activation signal to activate a respective amplifier stage; and
   a logic circuit connected to each comparator output; wherein
   one of the switch nodes is coupled directly to a first one of said comparator outputs and each of the remaining switch nodes is coupled to a respective output of the logic circuit.

3. An amplifier as recited in claim 2, wherein each switch node is coupled to a respective voltage level shift stage for activation thereof in response to a received switch activation signal from the switch node.

4. An amplifier as recited in claim 3, wherein each voltage level shift stage is coupled to a respective node of the second attenuation circuit.

5. An amplifier as recited in claim 3, wherein the control circuit further comprises a voltage to current converter circuit having inputs coupled, respectively, to the voltage control node to receive a voltage related to the control voltage, and the voltage level shift stages to receive voltage output from an activated level shift stage, and an output for supplying a current control signal.

6. An amplifier as recited in claim 5, wherein the control circuit further comprises a temperature compensation circuit, the temperature compensation circuit comprising a multiplier having a first input coupled to the output of the voltage to current converter for receiving the current control signal, a second input for receiving a temperature compensation signal, and an output coupled to an amplifier gain control circuit.

7. An amplifier as recited in claim 2, wherein each switch node is coupled to a respective input of an amplifier gain control circuit.

8. An amplifier as recited in claim 2, wherein:
   the voltage control node is connected to the first input of each comparator through a respective impedance;
   a junction between the first input of each comparator and its respective impedance is connected to a respective controlled switch;
   and each controlled switch is coupled to the switch node corresponding to the comparator to which it is coupled;
   wherein hysteresis is provided in transition between activated amplifier stages to avoid transition oscillation.

9. A method for controlling a variable gain amplifier having a plurality of amplifier stages, the method comprising the steps of:
   determining a unique control voltage level range for each amplifier stage;
   applying an input voltage to an input of a first one of the amplifier stages and applying, respectively, an attenuated level of the input voltage to an input of each successive amplifier stage;
   generating a control signal; and activating the amplifier stage for which the voltage level of the control signal is within the unique control voltage range as determined in the determining step, wherein no more than one of the amplifier stages is active at any time, wherein the step of determining comprises:

generating a reference signal; and assigning fractions of the reference signal voltage level to define boundaries between control voltage level ranges.

10. A method as recited in claim 9, wherein the activating step comprises:

comparing the control voltage with the lower boundary of the control voltage level range of each amplifier stage; and if the control voltage exceeds the lower boundary of the control voltage level range of one or more of the amplifier stages, selecting the amplifier having the lowest control voltage range boundary level that is exceeded by the control voltage.

11. A method as recited in claim 9, further comprising the steps of:

varying the level of the control voltage;

activating a new one of the amplifier stages when the level of the control voltage is within the control voltage level range for the new amplifier stage; and deactivating the previously activated amplifier stage upon activation of the new amplifier stage.

12. A method as recited in claim 11, further comprising the step of controlling the gain of an activated amplifier stage in accordance with the level of the control voltage.

13. A method as recited in claim 9, further comprising the step of adjusting the control voltage range of an amplifier stage upon activation thereof to avoid transitional hysteresis effects.

14. A method as recited in claim 13, wherein the adjusting step comprises reducing the lower boundary level of the control voltage range of the activated amplifier stage.

15. A method as recited in claim 9, further comprising the step of controlling the gain of an activated amplifier stage in response to the control voltage.

16. A method as recited in claim 15, wherein the step of controlling comprises shifting the voltage level of the control signal by an amount associated with the amplifier stage activated to produce a voltage level shifted control signal.

17. A method as recited in claim 16, wherein the step of controlling further comprises adjusting the voltage level shifted control signal to compensate for the effects of temperature.

18. A method as recited in claim 17, wherein the adjusting step comprises:

generating a temperature compensation signal;

multiplying the generated compensation signal by the voltage level shifted control signal.

19. A method as recited in claim 9, wherein, in response to a change in the control signal to a value outside the control voltage level for the activated amplifier stage, further comprising the steps of substantially simultaneously selecting a second amplifier stage corresponding to the control voltage range of the changed control signal, and applying to the second amplifier stage a shifted level of the control signal.

20. A method as recited in claim 19, wherein the step of selecting comprises generating a selection signal and the step of applying comprises activating the second amplifier stage and applying a gain control signal having a component that is level shifted from the control signal by an amount associated with the second amplifier stage.

* * * * *